(12) United States Patent
Hirano et al.

(10) Patent No.: US 12,493,244 B2
(45) Date of Patent: Dec. 9, 2025

(54) PHOTOSENSITIVE RESIN COMPOSITION, PHOTOSENSITIVE DRY FILM, AND PATTERN FORMATION METHOD

(71) Applicant: Shin-Etsu Chemical Co., Ltd., Tokyo (JP)

(72) Inventors: Yoshinori Hirano, Annaka (JP); Satoshi Asai, Annaka (JP); Takahiro Goi, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 905 days.

(21) Appl. No.: 17/770,140

(22) PCT Filed: Sep. 24, 2020

(86) PCT No.: PCT/JP2020/036015
§ 371 (c)(1),
(2) Date: Apr. 19, 2022

(87) PCT Pub. No.: WO2021/079679
PCT Pub. Date: Apr. 29, 2021

(65) Prior Publication Data
US 2022/0382157 A1 Dec. 1, 2022

(30) Foreign Application Priority Data

Oct. 21, 2019 (JP) .................. 2019-191991

(51) Int. Cl.
*G03F 7/075* (2006.01)
*C08G 59/32* (2006.01)

(52) U.S. Cl.
CPC .......... *G03F 7/0757* (2013.01); *C08G 59/32* (2013.01); *C08G 59/3227* (2013.01); *C08G 59/3245* (2013.01)

(58) Field of Classification Search
CPC ... G03F 7/0757; C08G 59/32; C08G 59/3227; C08G 59/3245
See application file for complete search history.

(56) References Cited

U.S. PATENT DOCUMENTS

| | | |
|---|---|---|
| 2008/0182087 A1 | 7/2008 | Kato et al. |
| 2016/0097974 A1 | 4/2016 | Asai et al. |
| 2016/0357105 A1* | 12/2016 | Asai ............... G03F 7/0757 |
| 2016/0358833 A1* | 12/2016 | Soga ............... G03F 7/0757 |
| 2020/0165364 A1* | 5/2020 | Higuchi ............ C08F 30/08 |
| 2020/0201182 A1 | 6/2020 | Hirano et al. |

FOREIGN PATENT DOCUMENTS

| | | | |
|---|---|---|---|
| JP | 2008-184571 A | 8/2008 | |
| JP | 2016-71355 A | 5/2016 | |
| JP | 2019011390 A * | 1/2019 | ............ C08F 30/08 |
| JP | 2019-179078 A | 10/2019 | |
| JP | 2020-98296 A | 6/2020 | |

OTHER PUBLICATIONS

International Search Report dated Dec. 15, 2020, issued in counterpart International Application No. PCT/JP2020/036015 (2 pages).

* cited by examiner

*Primary Examiner* — Mark F. Huff
*Assistant Examiner* — Richard David Champion
(74) *Attorney, Agent, or Firm* — WHDA, LLP

(57) ABSTRACT

Provided is a photosensitive resin composition which comprises (A) a polymer comprising repeating units represented by formula (A1) and at least one kind of repeating units selected from among repeating units represented by formula (A2) and repeating units represented by formula (A3), (B) an epoxy compound containing four or more epoxy groups on average in the molecule, (C) a photoacid generator, (D) a benzotriazole compound and/or an imidazole compound, and (E) an organic solvent.

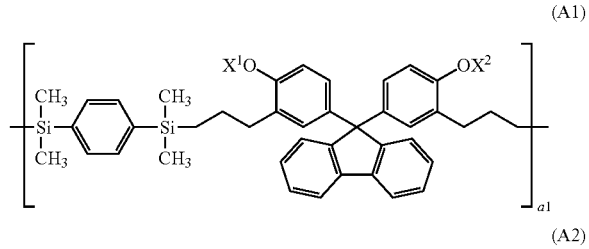

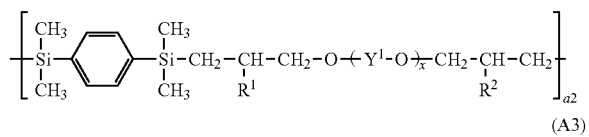

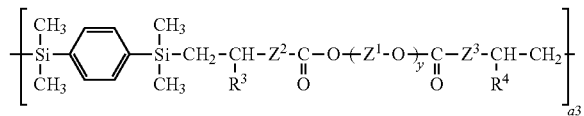

5 Claims, No Drawings

PHOTOSENSITIVE RESIN COMPOSITION, PHOTOSENSITIVE DRY FILM, AND PATTERN FORMATION METHOD

TECHNICAL FIELD

This invention relates to a photosensitive resin composition, photosensitive dry film and pattern forming process.

BACKGROUND ART

In the prior art, photosensitive protective films for semiconductor chips and photosensitive insulating films for multilayer printed circuit boards are formed of photosensitive polyimide compositions, photosensitive epoxy resin compositions, photosensitive silicone compositions, and the like. As the photosensitive material applied for the protection of such substrates and circuits, Patent Document 1 discloses a photosensitive silicone composition based on a silphenylene structure-containing silicone type polymer having improved flexibility. This composition has improved film properties, but a low resolution. It is desired to achieve further improvements in resolution and substrate adhesion in order that the composition be used in highly integrated 3D packages.

PRIOR ART DOCUMENTS

Patent Documents

Patent Document 1: JP-A 2008-184571

SUMMARY OF INVENTION

Technical Problem

An object of the invention, which has been made under the above-mentioned circumstances, is to provide a photosensitive resin composition which forms a resin coating or film that has improved film properties and can be readily processed even in thick film form to form a fine size pattern, a photosensitive dry film, and a pattern forming process.

Solution to Problem

Making extensive investigations to attain the above object, the inventors have found that a photosensitive resin composition comprising a polymer containing silphenylene and fluorene skeletons and having a crosslinking group or reactive site capable of crosslinking reaction in the molecule, an epoxy compound containing on the average at least four epoxy groups per molecule, a photoacid generator, a benzotriazole compound and/or imidazole compound, and an organic solvent has a high resolution and tight adhesion to substrates, and is suited as resist material for plating. The invention is predicated on this finding.

Accordingly, the invention provides a photosensitive resin composition, photosensitive dry film, and pattern forming process, as defined below.

1. A photosensitive resin composition comprising
   (A) a polymer comprising repeat units having the formula (A1) and repeat units of at least one type selected from repeat units having the formula (A2) and repeat units having the formula (A3), shown below,
   (B) an epoxy compound containing on the average at least four epoxy groups per molecule,
   (C) a photoacid generator,
   (D) a benzotriazole compound and/or imidazole compound, and
   (E) an organic solvent.

[Chem. 1]

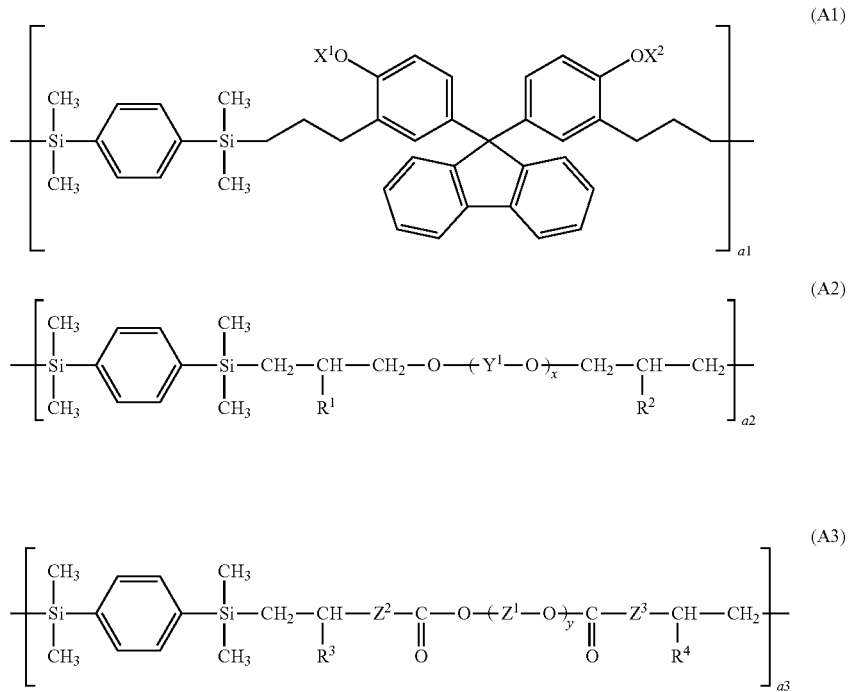

Herein $X^1$ and $X^2$ are each independently hydrogen or glycidyl group, $Y^1$ is a $C_1$-$C_5$ alkanediyl group, $Z^1$ is a $C_1$-$C_{10}$ straight alkanediyl group which may contain hydroxy, a $C_2$-$C_{10}$ branched alkanediyl group, or a divalent group having the formula (A4):

[Chem. 2]

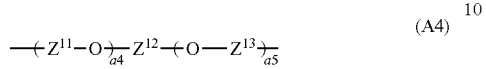

(A4)

wherein $Z^{11}$ and $Z^{13}$ are each independently a $C_1$-$C_5$ alkanediyl group, $Z^{12}$ is a $C_1$-$C_{30}$ hydrocarbylene group, a4 and a5 are each independently an integer of 1 to 50, $Z^2$ and $Z^3$ are each independently a single bond or a $C_1$-$C_{10}$ alkanediyl group, $R^1$, $R^2$, $R^3$, and $R^4$ are each independently hydrogen or a $C_1$-$C_{10}$ hydrocarbyl group, a1, a2, and a3 are numbers in the range: $0 < a1 < 1$, $0 \leq a2 < 1$, $0 \leq a3 < 1$, and $a1+a2+a3=1$.

x and y are each independently an integer of 1 to 50.

2. A photosensitive resin coating obtained from the photosensitive resin composition of 1.

3. A photosensitive dry film comprising a support film and the photosensitive resin coating of 2 thereon.

4. A pattern forming process comprising the steps of:
(a) applying the photosensitive resin composition of 1 onto a substrate to form a photosensitive resin coating thereon,
(b) exposing the photosensitive resin coating to radiation, and
(c) developing the exposed resin coating in an organic solvent.

5. A pattern forming process comprising the steps of:
(a') using the photosensitive thy film of 3 to form the photosensitive resin coating on a substrate.
(b) exposing the photosensitive resin coating to radiation, and
(c) developing the exposed resin coating in an organic solvent.

Advantageous Effects of Invention

The photosensitive resin composition and the photosensitive dry film of the invention have satisfactory properties as photosensitive material. From the composition or dry film, a film having a widely varying thickness can be formed. Even from a thick film, a fine size pattern of perpendicular profile can be formed.

DESCRIPTION OF EMBODIMENTS

[Photosensitive Resin Composition]

The invention provides a photosensitive resin composition comprising (A) a polymer containing a silphenylene skeleton and a fluorene skeleton and having a crosslinking group or reactive site capable of crosslinking reaction in the molecule, (B) an epoxy compound containing on the average at least four epoxy groups per molecule, (C) a photoacid generator, (D) a benzotriazole compound and/or imidazole compound, and (E) an organic solvent.

[Component (A)]

Component (A) is a polymer comprising repeat units having the formula (A1), and repeat units of at least one type selected from repeat units having the formula (A2) and repeat units having the formula (A3).

[Chem. 3]

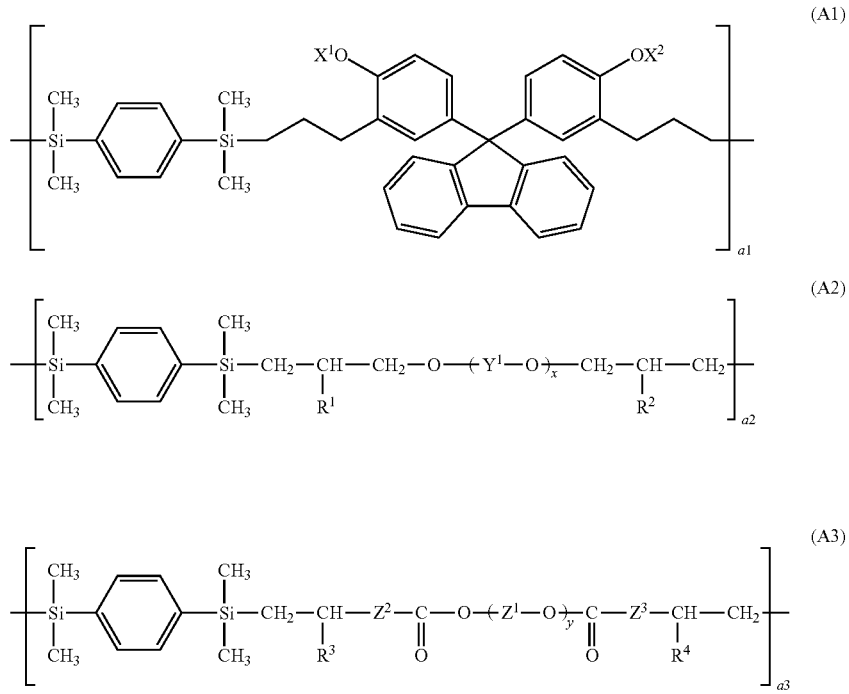

In formula (A1), $X^1$ and $X^2$ are each independently hydrogen or glycidyl group.

In formula (A2), $Y^1$ is a $C_1$-$C_5$ alkanediyl group. Suitable alkanediyl groups include methylene, ethane-1,1-diyl, ethane-1,2-diyl, propane-1,1-diyl, propane-1,2-diyl, propane-1,3-diyl, propane-2,2-diyl, butane-1,2-diyl, butane-1,3-diyl, butane-1,4-diyl, and pentane-1,5-diyl. Preferably $Y^1$ ethane-1,1-diyl, ethane-1,2-diyl, propane-1,1-diyl, propane-1,2-diyl, or propane-1,3-diyl.

In formula (A3), $Z^1$ is a $C_1$-$C_{10}$ straight alkanediyl group which may contain hydroxy, a $C_2$-$C_{10}$ branched alkanediyl group, or a divalent group having the formula (A4).

[Chem. 4]

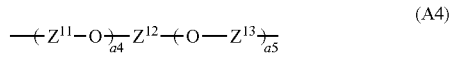
(A4)

Herein $Z^{11}$ and $Z^{13}$ are each independently a $C_1$-$C_5$ alkanediyl group, $Z^{12}$ is a $C_1$-$C_{30}$ hydrocarbylene group, a4 and a5 are each independently an integer of 1 to 50.

Examples of the straight alkanediyl group represented by $Z^1$ include methylene, ethane-1,2-diyl, propane-1,3-diyl, butane-1,4-diyl, pentane-1,5-diyl, hexane-1,6-diyl, heptane-1,7-diyl, octane-1,8-diyl, nonane-1,9-diyl, and decane-1,10-diyl.

Preferred examples of the hydroxy-containing straight alkanediyl group include hydroxy-substituted forms of propane-1,3-diyl, butane-1,4-diyl, pentane-1,5-diyl, hexane-1,6-diyl, heptane-1,7-diyl, octane-1,8-diyl, nonane-1,9-diyl, and decane-1,10-diyl, specifically 2-hydroxypropane-1,3-diyl, 2-hydroxybutane-1,4-diyl, and 3-hydroxybutane-1,4-diyl.

Examples of the $C_2$-$C_{10}$ branched alkanediyl group represented by $Z^1$ include ethane-1,1-diyl, propane-1,2-diyl, propane-2,2-diyl, butane-1,2-diyl, and butane-1,3-diyl.

Examples of the divalent group having formula (A4) are shown below, but not limited thereto.

[Chem. 5]

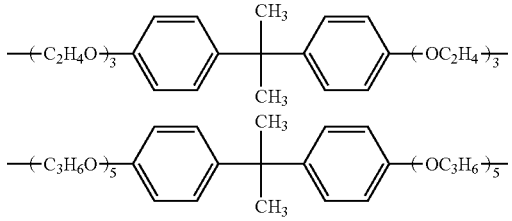

Of these, $Z^1$ is preferably selected from ethane-1,1-diyl, ethane-1,2-diyl, propane-1,2-diyl, propane-1,3-diyl, propane-2,2-diyl, butane-1,4-diyl, pentane-1,5-diyl, and hexane-1,6-diyl.

In formula (A3), $Z^2$ and $Z^3$ are each independently a single bond or a $C_1$-$C_{10}$ alkanediyl group.

In formulae (A2) and (A3), $R^1$, $R^2$, $R^3$ and $R^4$ are each independently hydrogen or a $C_1$-$C_{10}$ hydrocarbyl group. The hydrocarbyl group may be saturated or unsaturated and straight, branched or cyclic. Examples thereof include aliphatic hydrocarbyl groups such as $C_1$-$C_{10}$ alkyl groups and $C_3$-$C_{10}$ cyclic saturated hydrocarbyl groups, and aromatic hydrocarbyl groups such as $C_6$-$C_{10}$ aryl groups and $C_7$-$C_{10}$ aralkyl groups.

Suitable $C_1$-$C_{10}$ aliphatic hydrocarbyl groups include alkyl groups such as methyl, ethyl, n-propyl, isopropyl, n-butyl, isobutyl, sec-butyl, tort-butyl, n-pentyl n-heptyl, n-octyl, n-nonyl, and n-decyl, and cyclic saturated hydrocarbyl groups such as cyclopropyl, cyclobutyl cyclopentyl, cyclohexyl, norbornyl, and adamantyl. Suitable aryl groups include phenyl, 2-methylphenyl, 3-methylphenyl, 4-methylphenyl, 2-ethylphenyl, 3-ethylphenyl, 4-ethylphenyl, and dimethylphenyl. Suitable aralkyl groups include benzyl and phenethyl. Of these, $R^1$, $R^2$, $R^3$ and $R^4$ are preferably hydrogen or methyl.

In formulae (A1) to (A3), a1, a2, and a3 are numbers in the range: $0<a1<1$, $0\leq a2<1$, $0\leq a3<1$, and $a1+a2+a3=1$, preferably in the range: $0.20\leq a1\leq 0.95$, $0\leq a2\leq 0.80$, $0\leq a3\leq 0.80$, and $a1+a2+a3=1$; more preferably in the range: $0.30\leq a1\leq 0.95$, $0\leq a2\leq 0.70$, $0\leq a3\leq 0.70$, and $a1+a2+a3=1$.

In formulae (A2) and (A3), x and y are each independently an integer of 1 to 50, preferably 2 to 40, more preferably 3 to 30.

The polymer as component (A) should preferably have a weight average molecular weight (Mw) of 3,000 to 80,000, more preferably 5,000 to 50,000. As long as Mw is in the range, even a thick film of the polymer has a sufficient resolution. As used herein, Mw is measured versus polystyrene standards by gel permeation chromatography (GPC) using tetrahydrofuran (THF) as eluate.

The polymer may be prepared by combining a compound having the formula (1), a compound having the formula (2), and at least one of a compound having the formula (3) and a compound having the formula (4), and conducting addition polymerization in the presence of a metal catalyst.

[Chem. 6]

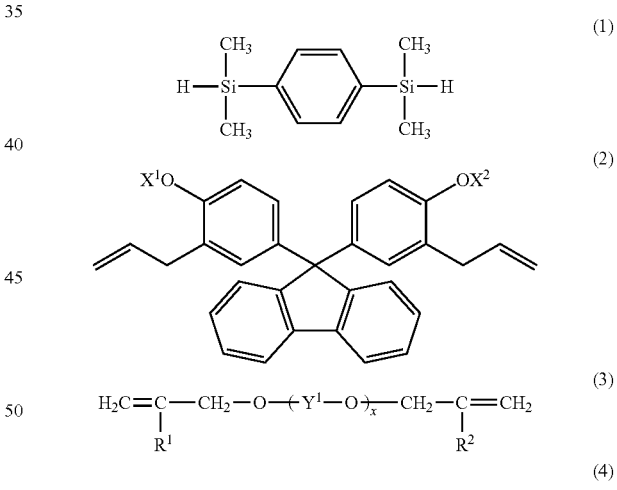

Herein $X^1$, $X^2$, $Y^1$, $Z^1$, $Z^2$, $Z^3$, $R^1$ to $R^4$, x and y are as defined above.

Examples of the metal catalyst used herein include platinum group metals alone such as platinum (including platinum black), rhodium and palladium; platinum chlorides, chloroplatinic acids and Chloroplatinates such as $H_2PtCl_4 \cdot xH_2O$, $H_2PtCl_6 \cdot xH_2O$, $NaHPtCl_6 \cdot xH_2O$, $KHPtCl_6 \cdot xH_2O$, $Na_2PtCl_6 \cdot xH_2O$, $K_2PtCl_4 \cdot xH_2O$, $PtCl_4 \cdot xH_2O$, $PtCl_2$ and $Na_2HPtCl_4 \cdot xH_2O$ wherein x is preferably an integer of 0 to 6, more preferably 0 or 6; Alcoholmodified chloroplatinic acids its described in U.S. Pat. No. 3,220,972; chloroplatinic acid-olefin complexes as described in U.S. Pat. Nos. 3,159,601, 3,159,662 and 3,775,452; supported catalysts comprising platinum group metals such as platinum black and palladium on supports of alumina, silica and carbon: rhodium-olefin complexes; chlorotris(triphenylphosphine)rhodium (known as Wilkinson's catalyst); and complexes of platinum chlorides, chloroplatinic acids and chloroplatinates with vinyl-containing siloxanes, specifically vinyl-containing cyclosiloxanes.

The catalyst is used in a catalytic amount, which is preferably 0.001 to 0.1% by weight of platinum group metal based on the total weight of compounds (1) to (4).

In the polymerization reaction, a solvent may be Used, if desired. Suitable solvents are hydrocarbon solvents such as toluene and xylene. Of polymerization conditions, the polymerization temperature is preferably in a range of 40 to 1.50° C., more preferably 60 to 120° C., within which the catalyst is not deactivated and the polymerization can be completed within a short time. The polymerization time varies with the type and amount of the starting compounds. It is preferably about 0.5 to about 100 hours, more preferably about 0.5 to about 30 hours for preventing moisture entry into the polymerization system. After the completion of reaction, the solvent (if used) is distilled off, whereupon the polymer is obtained.

The reaction procedure is not particularly limited. The preferred procedure is by first mixing a compound having formula, (2) with at least one compound selected from, compounds having formula (3) and compounds having formula (4), heating, adding a metal catalyst to the mixture, and then adding a compound having formula (1) dropwise over 0.1 to 5 hours.

The starting compounds are preferably combined in such amounts that a molar ratio of the hydrosilyl group on the compound having formula (1) to the total alkenyl group on the compound having formula (2), the compound having formula (3) and the compound having formula (4) may range from 0.67 to 1.67, more preferably from 0.83 to 1.25. The Mw of the polymer can be controlled using a molecular weight control agent such a monoallyl compound (e.g., o-allylphenol), monohydrosilane (e.g., triethylhydrosilane) or monohydrosiloxane.

[Component (B)]

Component (B) is an epoxy compound containing on the average at least four epoxy groups per molecule. Suitable epoxy compounds include compounds having the formulae (B1) to (B3), but are not limited thereto.

[Chem. 7]

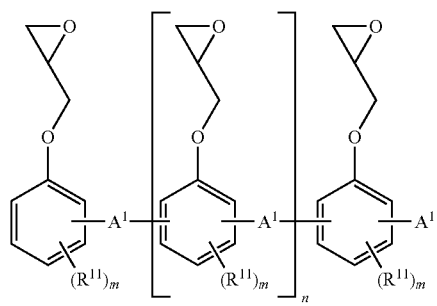

(B1)

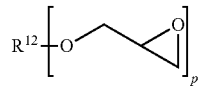

(B2)

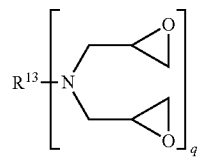

(B3)

In formula (B1), m is an integer of 0 to 2, and n is an integer of at least 2, preferably 2 to 10. $R^{11}$ is a $C_1$-$C_6$ saturated hydrocarbyl group. $A^1$ is each independently a $C_1$-$C_{10}$ hydrocarbylene group. Examples of the saturated hydrocarbyl group include alkyl groups and cyclic saturated hydrocarbyl groups as exemplified above for $R^1$ to $R^4$ in formulae (A2) and (A3).

In formulae (B2) and (B3), p is an integer of 4 to 8, and q is an integer of 2 to 4. $R^{12}$ is a $C_6$-$C_{30}$ p-valent hydrocarbon group which may contain at least one atom selected from nitrogen, oxygen and sulfur atoms. $R^{13}$ is a $C_6$-$C_{20}$ q-valent hydrocarbon group which may contain, at least one atom selected from nitrogen, oxygen and sulfur atoms.

Examples of the compound having formula (B) are show below, but not limited thereto.

[Chem. 8]

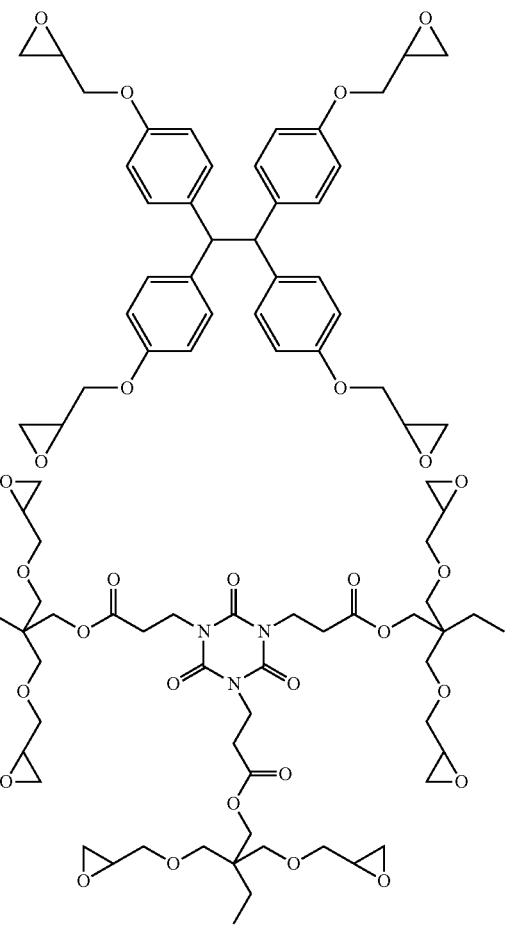

-continued

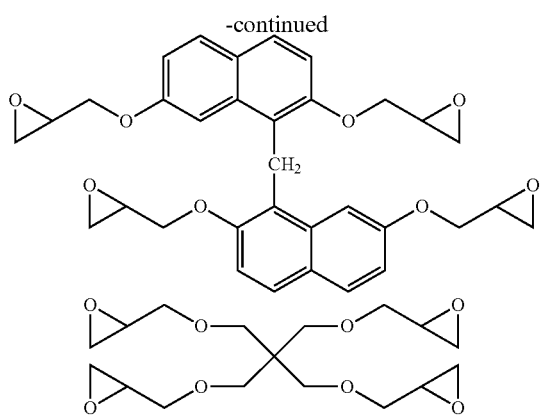

Examples of the compound having formula (B3) are shown below, but not limited thereto.

[Chem. 9]

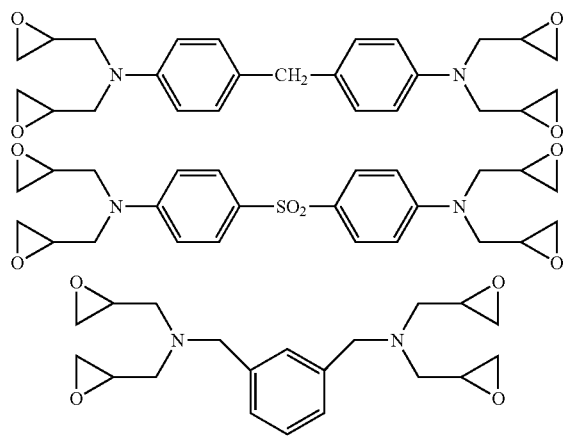

The amount of component (B) is preferably 30 to 200 parts by weight, more preferably 50 to 100 parts by weight per 100 parts by weight of component (A).

[Photoacid Generator (C)]

Component (C) is a photoacid generator which is not particularly limited as long as it generates an acid upon exposure to high-energy radiation. Examples of the high-energy radiation include UV, deep UV, and EB, specifically g-line, h-line, i-line, KrF excimer laser, ArF excimer laser, EB, and synchrotron radiation.

Suitable PAGs include onium salts (e.g., sulfonium and iodonium salts), sulfonyldiazomethane derivatives, N-sulfonyloxyimide PAGs, benzoin sulfonate PAGs, pyrogallol trisulfonate PAGs, nitrobenzyl sulfonate PAGs, sulfone PAGs, O-arylsulfonyloxime compound or O-alkylsulfonyloxime compound (oxime sulfonate) PAGs.

Sulfonium salts are salts of sulfonium cations with sulfonate anions. Exemplary sulfonium cations include triphenylsulfonium, (4-tert-butoxyphenyl)diphenylsulfonium, bis(4-tert-butoxyphenyl)phenylsulfonium, tris(4-tert-butoxyphenyl)sulfonium, (3-tert-butoxyphenyl)diphenylsulfonium, bis(3-tert-butoxyphenyl)phenylsulfonium, tris(3-tert-butoxyphenyl)sulfonium (3,4-di-tert-butoxyphenyl) diphenylsulfonium, bis(3,4-di-tert-butoxyphenyl) phenylsulfonium, tris(3,4-di-tert-butoxyphenyl)sulfonium, diphenyl(4-thiophenoxyphenyl)sulfonium, (4-tert-butoxycarbonylmethyloxyphenyl)diphenylsulfonium, tris(4-tert-butoxycarbonylmethyloxyphenyl)sulfonium, (4-tert-butoxyphenyl)bis(4-dimethylaminophenyl)sulfonium, tris(4-dimethylaminophenypsulfonium,
2-naphthyldiphenylsulfonium, dimethyl(2-naphthyl)sulfonium, 4-hydroxyphenyldimethylsulfonium, 4-methoxyphenyldimethylsulfonium trimethylsulfonium, 2-oxocyclohexylcyclohexylmethylsulfonium, trinaphthylsulfonium, and tribenzylsulfonium. Exemplary sultanate anions include trifluoromethanesulfonate, nonafluorobutanesulfonate heptadecafluorooctanesulfonate 2,2,2-trifluoroethanesulfonate, pentafluorobenzenesulfonate, 4-(trifluoromethyl)benzenesulfonate, 4-fluorobenzenesulfonate toluenesulfonate, benzenesulfonate, 4-(4-toluenesulfonyloxy)benzenesulfonate, naphthalenesulfonate, camphorsulfonate, octanesulfonate, dodecylbenzenesulfonate, butanesulfonate, and methanesulfonate. Further, salts of sulfonium cations with phosphoric acids, antimonic acids, alkylphosphoric acids and fluoroalkylphosphoric acids (i.e., some hydrogen on alkyl moiety is substituted by fluorine) are included.

Iodonium salts are salts of iodonium cations with sulfonate anions. Exemplary iodonium cations include aryl iodonium cations such as diphenyliodonium, bis(4-tert-butylphenyl)iodonium, 4-tert-butoxyphenylphenyliodonium, and 4-methoxyphenylphenyliodonium. Exemplary sulfonate anions include trifluoromethanesulfonate, nonafluorobutanesulfonate, heptadecafluorooctanesulfonate, 2,2,2-trifluoroethanesulfonate, pentafluorobenzenesulfonate, 4-(trifluoromethyl)benzenesulfonate, 4-fluorobenzenesulfonate, toluenesulfonate, benzenesulfonate, 4(4-toluenesulfonyloxy)benzenesulfonate, naphthalenesulfonate, camphorsulfonate, octanesulfonate, dodecylbezenesulfonate, butanesulfonate, and methanesulfonate. Iodonium salts based on combination of the foregoing examples are preferred.

Exemplary sulfonyldiazomethane compounds include bissulfonyldiazomethane compounds and sulfonylcarbonyldiazomethane compounds such as bis(ethylsulfonyl)diazomethane, bis(1-methylpropylsulfonyl)diazomethane, bis(2-methylpropylsulfonyl)diazomethane, bis(1,1-dimethylethylsulfonyl)diazomethane, bis(cyclohexylsulfonyl)diazomethane, bis(perfluoroisopropylsulfonyl)diazomethane, bis(phenylsulfonyl)diazomethane bis(4-methylphenylsulfonyl)diazomethane, bis(2,4-dimethylphenylsulfonyl)diazomethane, bis(2-naphthylsulfonyl)diazomethane, 4-methylphenylsulfonylbenzoyldiazomethane, tert-butylcarbonyl-4-methylphenylsulfonyldiazomethane, 2-naphthylsulfonylbenzoyldiazomethane, 4-methylphenylsulfonyl-2-naphthoyldiazomethane, methylsulfonylbenzoyldiazomethane, and tert-butoxycarbonyl-4-methylphenylsulfonyldiazomethane.

Suitable N-sulfonyloxyimide PAGs include imide compounds in which the nitrogen-bonded hydrogen is substituted by sulfonyloxy group. Suitable imide compounds include succinimide, naphthalene dicarboxylic acid imide, phthalimide, cyclohexyldicarboxylic acid imide, 5-norbornene-2,3-dicarboxylic acid imide, and 7-oxabicyclo[2.2.1]-5-heptene-2,3-dicarboxylic acid imide. Suitable sulfonyloxy groups include trifluoromethanesulfonyloxy, nonafluorobutanesulfonyloxy, heptadecafluorooctanesulfonyloxy, 2,2,2-trifluoroethanesulfonyloxy, pentafluorobenzenesulfonyloxy, 4-trifluoromethylbenzenesulfonyloxy, 4-fluorobenzenesulfonyloxy, toluenesalfonyloxy, benzenesulfonyloxy, naphthalenesulfonyloxy, camphorsulfonyloxy, octanesulfonyloxy, dodecylbenzenesulfonyloxy, butanesulfonyloxy, and methanesulfonyloxy.

Benzoinsulfonate PAGs include benzoin tosylate, benzoin mesylate, and benzoin butanesulfonate.

Pyrogallol trisulfonate PAGs include pyrogallol, phloroglucinol, catechol, resorcinol, and hydroquinone, in which all hydroxy groups are substituted by sulfonyloxy groups such as trifluoromethanesulfonyloxy, nonafluorobutanesulfonyloxy, heptadecafluorooctanesulfonyloxy, 2,2,2-trifluoroethanesulfonyloxy, pentafluorobenzenesulfonyloxy, 4-trifluoromethylbenzenesulfonyloxy, 4-fluorobenzenesulfonyloxy, toluenesulfonyloxy, benzenesulfonyloxy, naphthalenesulfonyloxy, camphorsulfonyloxy, octanesulfonyloxy, dodecylbenzenesulfonyloxy, butanesulfonyloxy, or methanesulfonyloxy.

Nitrobenzyl sulfonate PAGs include esters of nitrobenzyl alcohols with sulfonates, for example, 2,4-dinitrobenzyl sulfonates, 2-nitrobenzyl sulfonates, and 2,6-dinitrobenzyl sulfonates. Suitable sultanates include trifluoromethanesulfonate, nonafluorobutanesulfonate, heptadecafluorooctanesulfonate 2,2,2-trifluoroethanesulfonate, pentafluorobenzenesulfonate, 4-trifluoromethylbenzenesulfonate 4-fluorobenzenesulfonate, toluenesulfonate, benzenesulfonate, naphthalenesulfonate, camphorsulfonate, octanesulfonate, dodecylbenzenesulfonate, butanesulfonate, and methanesulfonate. Analogous nitrobenzyl sulfonate compounds in which the nitro group is substituted by trifluoromethyl are also useful PAGs.

Sulfone PAGs include bis(phenylsulfonyl)methane, bis(4-methylphenylsulfonyl)methane, bis(2-napthylsulfonyl)methane, 2,2-bis(phenylsulfonyl)propane, 2,2-bis(4-methylphenylsulfonyl)propane, 2,2-bis(2-naphthylsulfonyl)propane, 2-methyl-2-(p-toluenesulfonyl)propiophenone, 2-cyclohexylcarbonyl-2-(p-toluenesulfonyl)propane, and 2,4-dimethyl-2-(p-toluenesulfonyl)pentan-3-one.

Suitable O-arylsulfonyloxime compound and O-alkylsulfonyloxime compound (or oxime sulfonate) PAGs include photoacid generators in the form of glyoxime derivatives, oxime sulfonates with a long conjugated system separated by thiophene or cyclohexadiene, oxime sulfonates having an electron withdrawing group such as trifluoromethyl incorporated for increased stability, oxime sulfonates using phenylacetonitrile or substituted acetonitrile derivatives, and bisoxime sulfonates.

Glyoxime derivative PAGs include
bis-O-(p-toluenesulfonyl)-α-dimethylglyoxime,
bis-O-(p-toluenesulfonyl)-α-diphenylglyoxime,
bis-O-(p-toluenesulfonyl)-α-dicyclohexylglyoxime,
bis-O-(p-toluenesulfonyl)-2,3-pentanedionedioxime,
bis-O-(n-butanesulfonyl)-α-dimethylglyoxime,
bis-O-(n-butanesulfonyl)-α-diphenylglyoxime,
bis-O-(n-butanesulfonyl)-α-dicyclohexylglyoxime,
bis-O-(methanesulfonyl)-α-dimethylglyoxime,
bis-O-(trifluoromethanesulfonyl)-α-dimethylglyoxime,
bis-O-(2,2,2-trifluoroethanesulfonyl)-α-dimethylglyoxime,
bis-O-(10-camphorsulfonyl)-α-dimethylglyoxime,
bis-O-(benzenesulfonyl)-α-dimethylglyoxime,
bis-O-(4-fluorobenzenesulfonyl)-α-dimethylglyoxime,
bis-O-(4-trifluoromethylbenzenesulfonyl)-α-dimethylglyoxime,
bis-O-(xylenesulfonyl)-α-dimethylglyoxime, bis-O-(trifluoromethanesulfonyl)nioxime,
bis-O-(2,2,2-trifluoroethanesulfonyl)nioxime, bis-O-(10-camphorsulfonyl)nioxime,
bis-O-(benzenesulfonyl)nioxime, bis-O-(4-fluorobenzenesulfonyl)nioxime,
bis-O-(4-(trifluoromethyl)benzenesulfonyl)nioxime, and bis-O-(xylenesulfonyl)nioxime.

Photoacid generators in the form of oxime sulfonates with a long conjugated system separated by thiophene or cyclohexadiene include
(5-(p-toluenesulfonyl)oxyimino-5H-thiophen-2-ylidene)phenylacetonitrile,
(5-(10-camphorsulfonyl)oxyimino-5H-thiophen-2-ylidene)phenylacetonitrile,
(5-n-octanesulfonyloxyimino-5H-thiophen-2-ylidene)phenylacetonitrile,
(5-(P-toluenesulfonyl)oxyimino-5H-thiophen-2-ylidene)(2-methylphenyl)acetonitrile,
(5-(10-camphorsulfonyl)oxyimino-5H-thiophen-2-ylidene)(2-methylphenyl)acetonitrile,
(5-n-octanesulfonyloxyimino-5H-thiophen-2-ylidene)(2-methylphenyl)acetonitrile,
(5-(4-(p-toluenesalfonyloxy)benzenesulfonyl)oxyimino-5H-thiophen-2-ylidene)-phenylacetonitrile, and
(5-(2,5-bis(p-toluenesulfonyloxy)benzenesulfonyl)oxyamino-5H-thiophen-2-yliden)-phenylacetonitrile.

Suitable oxime sulfonates having an electron withdrawing group such as trifluoromethyl incorporated for increased stability include
2,2,2-trifluoro-1-phenylethanone O-(methylsulfonyl)oxime,
2,2,2-trifluoro-1-phenylethanone O-(10-camphorsulfonyl)oxime,
2,2,2-trifluoro-1-phenylethanone O-(4-methoxybenzenesulfonyl)oxime,
2,2,2-trifluoro-1-phenylethanone O-(4-naphthylsulfonyl)oxime,
2,2,2-trifluoro-1-phenylethanone O-(2-naphthylsulfonyl)oxime,
2,2,2-trifluoro-1-phenylethanone O-(2,4,6-trimethylphenylsulfonyl)oxime,
2,2,2-trifluoro-1-(4-methylphenyl)ethanone O-(10-camphorsulfonyl)oxime,
2,2,2-trifluoro-1-(4-methylphenyl)ethanone O-(methylsulfonyl)oxime,
2,2,2-trifluoro-1-(2-methylphenyl)ethanone O-camphorsulfonyl)oxime,
2,2,2-trifluoro-1-(2,4-dimethylphenyl)ethanone O-(10-camphorsulfonyl)oxime,
2,2,2-trifluoro-1-(2,4-dimethylphenyl)ethanone O-(1-naphthylsulfonyl)oxime,
2,2,2-trifluoro-1-(2,4-dimethylphenyl)ethanone O-(2-naphthylsulfonyl)oxime,
2,2,2-trifluoro-1-(2,4,6-trimethylphenyl)ethanone O-(10-camphorsulfonyl)oxime,
2,2,2-trifluoro-1-(2,4,6-trimethylphenyl)ethanone O-(1-naphthylsulfonyl)oxime,
2,2,2-trifluoro-1-(2,4,6-trimethylphenyl)ethanone O-(2-naphthylsulfonyl)oxime,
2,2,2-trifluoro-1-(4-methoxyphenyl)ethanone O-(methylsulfonyl)oxime,
2,2,2-trifluoro-1-(4-methylthiophenyl)ethanone O-(methylsulfonyl)oxime,
2,2,2-trifluoro-1-(3,4-dimethoxyphenyl)ethanone O-(methylsulfonyl)oxime,
2,2,2-trifluoro-1-(4-methoxyphenyl)ethanone O-(4-methylphenylsulfonyl)oxime,
2,2,2-trifluoro-1-(4-methoxyphenyl)ethanone O-(4-methoxyphenylsulfonyl)oxime,
2,2,2-trifluoro-1-(4-methoxyphenyl)ethanone O-(4-dodecylphenylsulfonyl)oxime,
2,2,2-trifluoro-1-(4-methoxyphenyl)ethanone O-(octylsulfonyl)oxime,
2,2,2-trifluoro-1-(4-thiomethylphenyl)ethanone O-(4-methoxyphenylsulfonyl)oxime, 2,2,2-trifluoro-1-(4-trimethylphenyl)ethanone O-(4-dodecylphenylsulfonyl)oxime,
2,2,2-trifluoro-1-(4-thiomethylphenyl)ethanone O-(octylsulfonyl)oxime,
2,2,2-trifluoro-1-(4-thiomethylphenyl)ethanone O-(2-naphthylsulfonyl)oxime,
2,2,2-trifluoro-1-(2-methylphenyl)ethanone O-(methylsulfonyl)oxime,
2,2,2-trifluoro-1-(4-methylphenyl)ethanone O-(phenylsulfonyl)oxime,
2,2,2-trifluoro-1-(4-chlorophenyl)ethanone O-(phenylsulfonyl)oxime,
2,2,3,3,4,4,4-heptafluoro-1-phenylbutanone O-(10-camphorsulfonyl)oxime,
2,2,2-trifluoro-1-(1-naphthyl)ethanone O-(methylsulfonyl)oxime,
2,2,2-trifluoro-1-(2-naphthyl)ethanone O-(methylsulfonyl)oxime,
2,2,2-trifluoro-1-(4-benzylphenyl)ethanone O-(methylsulfonyl)oxime,
2,2,2-trifluoro-1-(4-(phenyl-1,4-dioxa-but-1-yl)phenyl)ethanone O-(methylsulfonyl)oxime,
2,2,2-trifluoro-1-(1-naphthyl)ethanone O-(propylsulfonyl)oxime,
2,2,2-trifluoro-1-(2-naphthyl)ethanone O-(propylsulfonyl)oxime,
2,2,2-trifluoro-1-(4-benzylphenyl)ethanone O-(propylsulfonyl)oxime,
2,2,2-trifluoro-1-(4-methylsulfonylphenyl)ethanone O-(propylsulfonyl)oxime,
2,2,2-trifluoro-1-(4-methylsulfonyloxyphenyl)ethanone O-(propylsulfonyl)oxime,
2,2,2-trifluoro-1-(4-methylcarbonyloxyphenyl)ethanone O-(propylsulfonyl)oxime,
2,2,2-trifluoro-1-(6H,7H-5,8-dioxonaphth-2-yl)ethanone O-(propylsulfonyl)oxime,
2,2,2-trifluoro-1-(4-methoxycarbonylmethoxyphenyl)ethanone O-(propylsulfonyl)oxime,
2,2,2-trifluoro-1-(4-methoxycarbonyl)-(4-amino-1-oxapent-1-yl)phenyl)ethanone O-(propylsulfonyl)oxime,
2,2,2-trifluoro-1-(3,5-dimethyl-4-ethoxyphenyl)ethanone O-(propylsulfonyl)oxime,
2,2,2-trifluoro-1-(4-benzyloxyphenyl)ethanone O-(propylsulfonyl)oxime,
2,2,2-trifluoro-1-(2-thiophenyl)ethanone O-(propylsulfonate)oxime,
2,2,2-trifluoro-1-(1-dioxathiophen-2-yl)ethanone O-(propylsulfonate)oxime,
2,2,2-trifluoro-1-(4-(3-(4-(2,2,2-trifluoro-1-(trifluoromethanesulfonyloxyimino)ethyl)-phenoxy)propoxy)phenyl)edianone O-(trifluoromethanesulfonyl)oxime,
2,2,2-trifluoro-1-(4-(3-(4-(2,2,2-trifluoro-1-(1-propanesulfonyloxyimino)ethyl)phenoxy)-propoxy)phenyl)ethanone O-(propylsulfonyl)oxime,
2,2,2-trifluoro-1-(4-(3-(4-(2,2,2-trifluoro-1-(1-butanesulfonyloxyimino)ethyl)phenoxy)-propoxy)phenyl)ethanone O-(butylsulfonyl)oxime,
2,2,2-trifluoro-1-(4-(3-(4-(2,2,2-trifluoro-1-(4-(4-methylphenylsalfbnyloxy)phenyl-sulfonyloxymino)ethyl)phenoxy)propoxy)phenyl)ethanone O-(4-(4-methylphenylsulfonyloxy)plienylsulfonypoxime, and
2,2,2-trifluoro-1-(4-(3-(4-(2,2,2-trifluoro-1-((2,5-bis(4-methylphenylsulfonyloxy)-benzenesulfonyloxy)phenylsulfonyimino)ethyl)phenoxpropoxy)phenyl)ethanone O-(2,5-bis(4-methylphenylsulfonyloxy)benzenesulfonyloxy)phenylsulfonyl)oxime.

Suitable oxime sulfonate PAGs using substituted acetonitrile derivatives include
α-(p-tolnenesulfonyloxyimino)-phenylacetonitrile,
α-(p-chlorobenzenesulfonyloxyamino)-phenylacetonitrile,
α-(4-nitrobenzenesulfonyloxyamino)-phenylacetonitrile,
α-(4-nitro-2-trifluoromethylbenzenesulfonyloxyimino)-phenylacetonitrile,
α-(benzenesulfonyloxyimino)-4-chlorophenylacetonitrile,
α-(benzenesulfonyloxyimino)-2,4-dichlorophenylacetonitrile,
α-(benzenesulfonyloxyimino)-2,6-dichlorophenylacetonitrile,
α-(benzenesulfonyloxyimino)-4-methoxyphenylacetonitrile
α-(2-chlorobenzenesulfonyloxyamino)-4-methoxyphenylacetonitrile,
α-(benzenesulfonyloxyimino)-2-thienylacetonitrile,
α-(4-dodecylbenzenesulfonyloxyimino)-phenylacetonitrile,
α-[(4-toluenesulfonyloxyimino)-4-methoxyphenyl]acetonitrile,
α-[(dodecylbenzenesulfonyloxyimino)-4-methoxyphenyl]acetonitrile,
α-(tosyloxyimino)-3-thienylacetonitrile,
α-(methylsulfonyloxyimino)-1-cyclopentenylacetonitrile,
α-(ethylsulfonyloxyimino)-1-cyclopentenylacetonitrile,
α-(isopropylsulfonyoxyimino)-1-cyclopentenylacetonitrile
α-(n-butylsulfonyloxyimino)-1-cyclopentenylacetonitrile,
α-(ethylsulfonyloxyimino)-1-cyclohexenylacetonitrile,
α-(isopropylsulfonyloxyimino)-1-cyclohexenylacetonitrile, and
α-(n-butylsulfonyloxyimino)-1-cyclohexenylacetonitfile.

Suitable bisoxime sulfonate PAGs include
bis(α-(p-toluenesulfonyloxy)imino)-p-phenylenediacetonitrile,
bis(α-(benzenesulfonyloxy)imino)-p-phenylenediacetonitrile,
bis(α-(methanesulfonyloxy)imino)-p-phenylenediacetonitrile,
bis(α-(butanesulfonyloxy)imino)-p-phenylenediacetonitrile,
bis(α-(10-camphorsulfonyloxy)iminio)-p-phenylenediacetonitrile,
bis(α-(trifluoromethanesulfonyloxy)imino)-p-phenylenediacetonitrile,
bis(α-(4-methoxybenzenesulfonyloxy)imino)-p-phenylenediacetonitrile,
bis(α-(p-toluenesulfonyloxy)imino)-m-phenylenediacetonitrile,
bis(α-(benzenesulfonyloxy)imino)-m-phenylenediacetonitrile,
bis(α-(methanesulfonyloxy)imino)-m-phenylenediacetonitrile,
bis(α-(butanesulfonyloxy)imino)-m-phenylenediacetonitrile,
bis(α-(10-camphorsulfonyloxy)imino)-m-phenylenediacetonitrile,
bis(α-(trifluoromethanesulfonyloxy)imino)-m-phenylenediacetonitrile, and
bis(α-(4-methoxybenzenesulfonyloxy)imino)-m-phenylenediacetonitrile.

Also oxime sulfonates having the formula (C1) are useful PAGs.

[Chem. 10]

(C1)

Herein $R^{21}$ is an optionally substituted $C_1$-$C_{10}$ haloalkylsulfonyl or halobenzenesulfonyl group. $R^{22}$ is a $C_1$-$C_{11}$ haloalkyl group. $R^{23}$ is an optionally substituted aryl group or hetero-aryl group.

Examples of the oxime sulfonate having formula (C1) include
2-[2,2,3,3,4,4,5,5-octafluoro-1-(nonafluorobutylsulfonyloxyimino)pentyl]fluorene,
2-[2,2,3,3,4,4-pentafluoro-1-(nonafluorobutylsulfonyloxyimino)butyl]fluorene,
2-[2,2,3,3,4,4,5,6,6-decafluoro-1-(nonafluorobutylsulfonyloxyimino)hexyl]fluorene,
2-[2,2,3,3,4,4,5,5-octafluoro-1-(nonafluorobutylsulfonyloxyimino)pentyl]-4-biphenyl,
2-[2,2,3,3,4-pentafluoro-1-(nonafluorobutylsulfonyloxyimino)butyl]-4-biphenyl, and
2-[2,2,3,3,4,4,5,5,6,6-decafluoro-1-(nonafluorobutylsulfonyloxyimino)hexyl]-4-biphenyl.

Among these, the preferred PAGs are sulfonium salts, bissulfonyldiazomethanes, N-sulfonyloxyimides, and sulfonyloxime compounds.

Although the optimum anion of the generated acid varies with a particular polymer, an anion which is non-volatile and not extremely highly diffusive is generally selected. Appropriate anions include anions of benzenesulfonic acid, toluenesulfonic acid, 4-(4-toluenesulfonyloxy)benzenesulfonic acid, pentafluorobenzenesulfonic acid, 2,2,2-trifluoroethanesulfonic acid, nonafluorobutanesulfonic acid, heptadecafluorooctanesulfonic acid, and camphorsulfonic acid. Where reaction with high sensitivity is necessary, phosphate anions and alkylphosphate anions in which some hydrogen is substituted by fluorine may be used.

The PAG is preferably added in an amount of 0.2 to 20 parts, more preferably 0.3 to 10 parts by weight per 100 parts by weight of component (A). The amount of PAG in the range ensures a practically acceptable sensitivity and pattern profile. The PAG may be used alone or in admixture of two or more. The transmittance of the resist film can be controlled by using a PAG having a low transmittance at the exposure wavelength and adjusting the amount of the PAG added.

[Component (D)]

The benzotriazole compound as component (D) is typically selected from compounds having the formulae (D1) and (D2).

[Chem. 11]

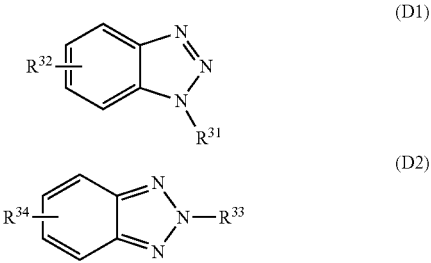

In formulae (D1) and (D2), $R^{31}$ and $R^{33}$ are each independently hydrogen, hydroxy, amino, an optionally substituted $C_1$-$C_6$alkyl, optionally substituted phenyl, sulfonyl-containing substituent group, or -$A^1$-$A^2$. $A^1$ is a carbonyl group, saturated hydrocarbylene group or -$A^{11}$-O— wherein $A^{11}$ is a $C_1$-$C_{12}$ saturated hydrocarbylene group. $A^2$ is hydrogen, halogen, cyano, hydroxy, $C_1$-$C_6$ saturated hydrocarbyloxy, carboxy, or dihydrocarbylamino group in which each hydrocarbyl moiety has 1 to 6 carbon atoms. The saturated hydrocarbylene group and hydrocarbyl moiety in the saturated hydrocarbyloxy group and dihydrocarbylamino group may be straight, branched or cyclic.

In formulae (D1) and (D2), $R^{32}$ and $R^{34}$ are each independently hydrogen, halogen, hydroxy, optionally substituted $C_1$-$C_6$ saturated hydrocarbyl, $C_1$-$C_6$ saturated hydrocarbyloxy, sulfonyl-containing substituent group, or an organic group having the formula (D3).

[Chem. 12]

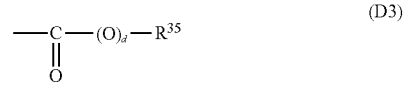

(D3)

Herein $R^{35}$ is hydrogen or an optionally substituted $C_1$-$C_{12}$ saturated hydrocarbyl group, and d is 0 or 1.

Examples of the benzotriazole compound include benzotriazole,
1-hydroxybenzotriazole, 1-methylbenzotriazole, 1-hydroxymethylbenzotriazole
1-ethylbenzotriazole, 1-(1-hydroxyethyl)benzotriazole 1-(2-hydroxyethyl)benzotriazole,
1-propylbenzotriazole, 1-(1-hydroxypropyl)benzotriazole,
1-(2-hydroxypropyl)benzotriazole, 1-(3-hydroxypropyl)benzotriazole,
4-hydroxy-1H-benzotriazole  5-methyl-1H-benzotriazole, benzotriazole-5-carboxylic acid,
1-methylbenzotriazole-5-carboxylic acid, 1-ethylbenzotriazole-5-carboxylic acid,
1-t-butylbenzotriazole-5-carboxylic acid,
1-(2-cyclopentylethyl)benzotriazole-5-carboxylic acid, 1H-benzotriazole-4-sulfonic acid,
1H-benzotriazole-1-acetonitrile, 1H-benzotriazole-1-carboxyaldehyde,
2-methyl-2H-benzotriazole and 2-ethyl-2H-benzotriazole.

The imidazole compound as component (D) is typically selected from compounds having the formulae (D4) to (D9).

[Chem. 13]

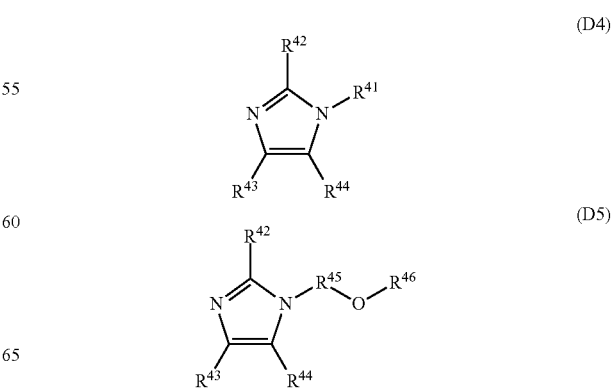

-continued

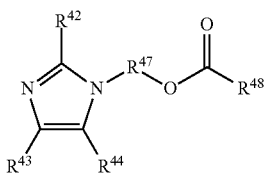

(D6)

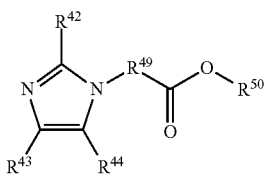

(D7)

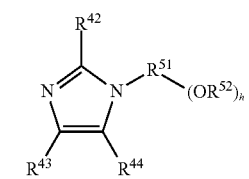

(D8)

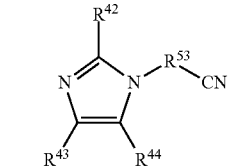

(D9)

In formulae (D4) to (D9), $R^{41}$ is hydrogen, a $C_2$-$C_{20}$ saturated hydrocarbyl group, or $C_2$-$C_{20}$ saturated hydrocarbyl group having at least one polar functional moiety selected from among hydroxy, carbonyl, ester, ether, sulfide, carbonate, cyano and acetal. $R^{42}$, $R^{43}$ and $R^{44}$ are each independently hydrogen, a $C_1$-$C_{10}$ saturated hydrocarbyl group, $C_6$-$C_{10}$ aryl group $C_7$-$C_{10}$ aralkyl group. $R^{45}$, $R^{47}$, $R^{49}$ and $R^{53}$ are each independently a $C_1$-$C_{10}$ saturated hydrocarbylene group. $R^{46}$ and $R^{48}$ are each independently hydrogen or a $C_1$-$C_{15}$ saturated hydrocarbyl group which may contain at least one moiety selected from among hydroxy, carbonyl, ester, ether, sulfide, carbonate, cyano and acetal. $R^{50}$ is a $C_1$-$C_{15}$ saturated hydrocarbyl group which may contain at least one moiety selected from among hydroxy, carbonyl, ester, ether, sulfide, carbonate, cyano and acetal. $R^{51}$ is a (h+1)-valent $C_2$-$C_{10}$ hydrocarbon group. $R^{52}$ is each independently hydrogen or a $C_1$-$C_{15}$ saturated hydrocarbyl group which may contain at least one moiety selected from among hydroxy, carbonyl, ester, ether, sulfide, carbonate, cyano and acetal, or two groups $R^{52}$ may bond together to form a ring, and h is 2, 3, 4 or 5.

Preferred examples of the imidazole compound include imidazole, 2-methylimidazole, 4-methylimidazole 1,2-dimethylimidazole, 2-ethyl-4-methylimidazole, 2-phenylimidazole, 2-phenyl-4-methylimidazole, 1-methoxymethylimidazole, N-tert-butoxycarbonylimidazole, 1-(2-cyanoethyl)-2-methylimidazole, 1-(2-hydroxyethyl)imidazole, 1-(carboxymethyl)imidazole, and 2-methyl-1-vinylimidazole.

Component (D) is preferably used in an amount of 0.01 to 10 parts, more preferably 0.02 to 5 parts by weight per 100 parts by weight of component (A). An amount of component (D) in the range ensures to form a pattern at a practically acceptable sensitivity.

[Component (E)]

The organic solvent as component (E) is not particularly limited as long as Other components are soluble therein and satisfactory coating properties are achievable. Suitable organic solvents include cellosolve solvents such as methyl cellosolve, ethyl cellosolve, methyl cellosolve acetate, and ethyl cellosolve acetate; propylene glycol solvents such as propylene glycol and dipropylene glycol: propylene glycol alkyl ether solvents such as propylene glycol monomethyl ether (PGME) and propylene glycol monobutyl ether; propylene glycol alkyl ether acetate solvents such as propylene glycol monomethyl ether acetate (PGMEA), propylene glycol dimethyl ether, and propylene glycol monoethyl ether acetate; ester solvents such as butyl acetate, pentyl acetate, methyl lactate, ethyl lactate, methyl 3-methoxypropionate, and ethyl 3-ethoxypropionate; alcohol solvents such as methanol, ethanol, isopropanol, butanol, hexanol, and diacetone alcohol; ketone solvents such as acetone, cyclohexanone, cyclopentanone, methyl ethyl ketone, methyl pentyl ketone, and methyl isobutyl ketone; ether solvents such as methyl phenyl ether and diethylene glycol dimethyl ether; highly polar solvents such as N,N-dimethylformamide, N-methylpyrrolidone and dimethyl sulfoxide; and mixtures thereof.

Of these solvents, propylene glycol alkyl ether acetates, alkyl lactates, and alkyl ketones are preferred. It is noted that the alkyl group of the propylene glycol alkyl ether acetate is preferably of 1 to 4 carbon atoms, for example, methyl, ethyl and propyl, with methyl and ethyl being especially preferred. Since the propylene glycol alkyl ether acetates include 1,2- and 1,3-substituted ones, each includes three isomers depending on the combination of substituted positions, which may be used alone or in admixture. Also, the alkyl group of the alkyl lactate is preferably of 1 to 4 carbon atoms, for example, methyl, and propyl with methyl 4 and ethyl being especially preferred. The alkyl group of the alkyl ketone is preferably of 1 to 10 carbon atoms, for example, methyl, ethyl, propyl, isobutyl, cyclopentyl and cyclohexyl, with isobutyl, cyclopentyl and cyclohexyl being especially preferred.

The amount of component (E) is preferably 20 to 90% by weight, more preferably 25 to 70% by weight of the composition. An amount of component (E) in the range ensures to form a film with a uniform thickness and avoids the risk of defects in the film.

[Other Components]

In addition to the aforementioned components, the photosensitive resin composition may contain additives, for example, surfactants. Examples of the surfactant include nonionic surfactants, for example, polyoxyethylene alkyl ethers such as polyoxyethylene lauryl ether, polyoxyethylene stearyl ether, polyoxyethylene cetyl ether, and polyoxyethylene oleyl ether, polyoxyethylene alkylaryl ethers such as polyoxyethylene octylphenyl ether and polyoxyethylene nonylphenyl ether, polyoxyethylene polyoxypropylene block copolymers, sorbitan fatty acid esters such as sorbitan monolaurate, sorbitan monopalmitate, and sorbitan monostearate, polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate, and polyether silicone; fluorochemical surfactants such as EFTOP® EF301, EF303 and EF352 (Tohkem Products Co., Ltd.), Megaface® F171, F172 and F173 (PIC Corp.), Fluorad® FC-4430, FC-430 and FC-431 (3M), Surfynol® E1004 (Nissin Chemical Industry Co., Ltd.), Asahiguard® AG710, Surflon® S-381, S-382, SC101, SC102, SC103, SC104, SC105, SC106, KH-10, KH-20, KH-30 and KH-40 (AGC Seimi Chemical Co., Ltd.); organosiloxane polymers KP341, X-70-092 and X-70-093 (Shin-Etsu Chemical Co., Ltd.), acrylic acid or methacrylic acid Polyflow No. 75 and No. 95 (Kyoeisha Ushi Kagaku Kogyo Co., Ltd.). Inter alia, FC-4430 and X-70-093 are preferred. These surfactants may be used alone or in admixture.

The surfactant is preferably added in an amount of up to 5 parts, and more preferably up to 2 parts by weight per 100 parts by weight of component (A).

In the photosensitive resin composition, other optional components may be added, for example, light absorbing substances for reducing diffuse reflection from the substrate (e.g., dyes), compounds having 1,2-naphthoquinonediazidesulfonyl group in the molecule, basic compounds, sensitizers, crosslinkers, photobase generators, and acid amplifiers. Such optional components may be added in conventional amounts as long as they do not compromise the benefits of the invention.

The photosensitive resin composition may be prepared, for example, by dissolving components (A) to (P) and optional components in an organic solvent (E) at the same time or in an arbitrary order, to for a uniform solution of photosensitive resin composition. If necessary, the resulting solution may be passed through a filter.

[Pattern Forming Process Using Photosensitive Resin Composition]

Another embodiment of the invention is a pattern forming process using the photosensitive resin composition defined above, the process comprising the steps of (a) applying the photosensitive resin composition onto a substrate to form a photosensitive resin coating thereon, (b) exposing the photosensitive resin coating to radiation, and (c) developing the exposed resin coating in an organic solvent.

In step (a), a photosensitive resin coating is formed on a substrate using the photosensitive resin composition. Examples of the substrate include substrates of Si, $SiO_2$, SiN, SiON, TiN, WSi, BPSG, and SOG, metal substrates of Au, Ti, W, Cu, Ni—Fe, Ta, Zn, Co and Pb, and organic antireflection coatings.

In forming the photosensitive resin coating, typically the photosensitive resin composition is applied onto the substrate by a suitable coating technique, for example, spin coating, roll coating, flow coating, dipping, spraying, doctor blade coating or the like, in such a coating weight that the coating may have a desired thickness. If necessary, the coating is prebaked on a hot plate or in an oven at 60 to 150° C. for 0.5 to 120 minutes, preferably at 80 to 130° C. for 1 to 90 minutes.

Next, in step (b), the photosensitive resin coatings exposed to radiation. The exposure preferably uses radiation of wavelength at least 300 nm, more preferably 300 to 500 nm. Examples of radiation include UV radiation such as g-line and i-line. An appropriate exposure dose is about 1 to 5,000 $mJ/cm^2$, more preferably about 10 to 4,000 $mJ/cm^2$.

Exposure may be made through a photomask. The photomask may be, for example, one perforated with a desired pattern. Although the material of the photomask is not particularly limited, a material capable of shielding radiation in the above wavelength range is preferred. For example, a mask having a light-shielding film of chromium is used although the mask is not limited thereto.

The next step may be post-exposure bake (PEB). PEB is typically performed on a hot plate or in an oven at 60 to 150° C. for 1 to 90 minutes, preferably at 80 to 130° C. for 1 to 60 minutes.

The exposure or PEB is followed by the step (c) of developing the exposed resin coating in an organic solvent. The organic solvent is preferably selected from alcohols such as isopropyl alcohol (IPA), ketones such as cyclohexanone, and glycols such as PGME. The solvent used in the photosensitive resin composition may be used.

Development is effected by a conventional mode, for example, a dip, puddle or spray mode. The development is followed by washing, rinsing and drying if necessary. In this way, a photosensitive resin coating having the desired pattern is obtained. Although the developing time is selected depending on the thickness of the photosensitive resin coating, the time is typically 0.1 to 180 minutes, preferably 0.5 to 120 minutes.

[Photosensitive Dry Film]

A further embodiment of the invention is a photosensitive dry film comprising a support film and the photosensitive resin coating formed thereon from the photosensitive resin composition.

A clean room having a cleanness of up to 1,000 includes a zone kept at a temperature of 5 to 45° C., preferably 15 to 35° C. and a humidity of 5 to 90%, preferably 10 to 70%, where a film coater is set. Examples of the film coater include a forward roll coater, reverse roll coater, comma coater, die coater, lip coater, gravure coater, dip coater, air knife coater, capillary coater, raising and rising (R&R) coater, blade coater, bar coater, applicator, and extrusion molding machine. By means of the film coater, the photosensitive resin composition is coated onto a support film, e.g., thermoplastic film or parting substrate. The coating speed is preferably 0.05 to 1,000 m/min, more preferably 0.1 to 500 m/min.

After coating of the photosensitive resin composition, the coated support is passed through an in-line dryer or hot air circulating oven preferably at 40 to 130° C. for 1 to 40 minutes, more preferably at 50 to 120° C. for 2 to 30 minutes, until the organic solvent and any volatiles are removed. By drying in this way, a photosensitive resin coating or film is formed on the support. A photosensitive dr y film laminate may be constructed through solvent removal by infrared irradiation instead of the in-line dryer, or a combination of plural drying means such as simultaneous use of in-line dryer and infrared irradiation. If necessary, a protective film (or another parting substrate) may be press bonded to the photosensitive resin coating by means of a roll laminator, yielding a laminate.

Preferably, the photosensitive resin coating formed on the support film has a thickness of 10 to 700 μm, more preferably 50 to 600 μm, and an organic solvent content of 0 to 15% by weight.

In one embodiment the photosensitive resin coating may be continuously formed on the support film to yield a length of photosensitive dry film, which is wound up in film roll form which is easy to handle. This is also true when the photosensitive dry film is overlaid with the protective film.

The protective film (like the support film) is not particularly limited as long as it does not adversely affect the shape of the photosensitive thy film and can be separated from the photosensitive resin coating. The film may be a single polymer film or a multilayer film consisting of a plurality of polymer layers. Use may be made of any plastic films including nylon film, polyethylene (PE) film, polyethylene terephthalate (PET) film, polyethylene naphthalate film, polyphenylene sulfide (PPS) film, polypropylene (PP) film, polystyrene film polymethylpentene (TPX) film, polycarbonate film, fluoro-resin film, special polyvinyl alcohol (PVA) film, and polyester film which has been treated with a parting agent.

Of these, films of PET and PE are preferred as the protective film because of appropriate flexibility. Commercial available films may be used as well. Useful PET films are as mentioned above. Useful PE films include GF-8 (Tamapoly Co., Ltd.), PE FILM 0 TYPE (Nippa Corp.), Toretec 7332, Toretec 7111 and Toretec 7721 (Toray Advanced Film Co., Ltd.).

The support film and the protective film each have a thickness of preferably 10 to 150 μm, more preferably 25 to 100 μm, from the viewpoints of consistent film formation and anti-curling from the roll state wound around the windup mandrel.

[Pattern Forming Process Using Photosensitive Dry Film]

A still further embodiment of the invention is a pattern forming process comprising the steps of (a') using the photosensitive dry film to form the photosensitive resin coating on a substrate, (b) exposing the photosensitive resin coating to radiation, and (c) developing the exposed resin coating in an organic solvent.

In step (a') the photosensitive dry film is used to form the photosensitive resin coating on a substrate. The substrate is selected from plastic films or sheets, semiconductor substrates of Si, Cu, $SiO_2$, SiN, SiON, WSi, BPSG and SOG, metal substrates of Au, Ti, W, Cu, Ni—Fe, Ta, Zn, Co and Pb, and organic substrates such as organic antireflective coatings. The substrate may have steps (raised and recessed portions) on its surface, which are typically left after formation of a circuit or dielectric resin layer by plating or sputtering. Such steps are preferably in the range of 0 to about 500 μm, more preferably about 3 to 400 μm, even more preferably about 5 to 300 μm.

The photosensitive dry film is bonded to the substrate using a suitable laminator such as vacuum laminator or roll laminator, after which the support is peeled whereby the photosensitive resin coating is transferred to the substrate. The substrate may be of a stepped structure as mentioned above. In this case, the photosensitive resin coating having an appropriate thickness corresponding to the height of steps is used so that the photosensitive resin coating, may be buried in steps. The photosensitive resin coating is advantageously applicable to a substrate having steps of the order of 0 to 500 μm. Although the omission of bake after the transfer step raises no problems, the transfer step may be fallowed by prebake. When prebake is performed, the assembly may be prebaked on a hotplate or in an oven at 60 to 150° C. for 1 to 90 minutes, preferably at 80 to 130° C. for 1 to 30 minutes.

Step (a') is followed by steps (b) and (c) in the same manner as in the pattern forming process using the photosensitive resin composition whereby a pattern is formed

[Plating Step]

After the development step, electroplating or electroless plating may be carried out to form a metal plating layer on the resin pattern-bearing substrate. That is, a metal plating, pattern is obtained. The plating step may be performed by an electroplating or electroless plating method to deposit a conductor pattern, after which the resist pattern is removed.

Suitable electroplating or electroless plating methods include electrolytic Cu plating, electroless CU plating, electrolytic Ni plating, electroless Ni plating, and electrolytic Au plating. Plating may be performed in any well-known plating baths and under standard conditions. The thickness of a plating layer is typically 80 to 120% of the thickness of the resist pattern. For example, a resist pattern of 1 μm thick is formed on a seed layer of Cu, after which a Cu plating pattern of 0.8 to 1.2 μm thick is deposited thereon by electrolytic Cu plating.

EXAMPLES

Synthesis Examples, Examples, and Comparative Examples are given below for illustrating the invention although the invention is not limited thereto. Herein, the Mw is measured by GPC versus monodisperse polystyrene standards using GPC column TSKgel Super HZM-H (Tosoh Corp.) under analytical conditions: flow rate 0.6 mL/min, tetrahydrofuran eluent, and column temperature 40° C.

Compounds (M-1) to (M-5) used in Synthesis Examples are shown below.

[Chem. 14]

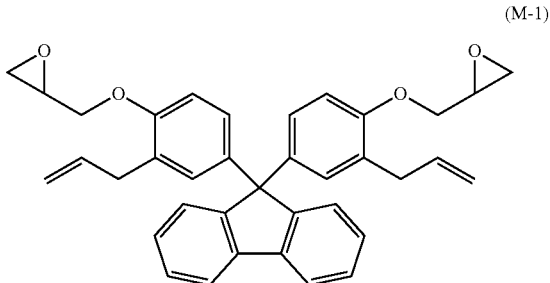
(M-1)

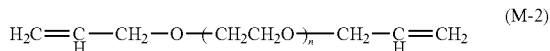
(M-2)

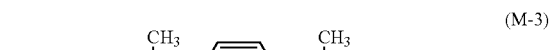
(M-3)

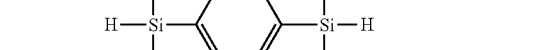
(M-4)

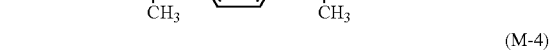

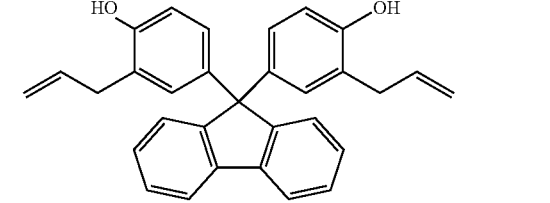
(M-5)

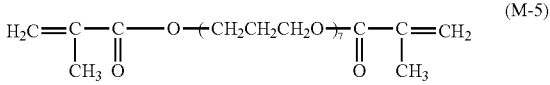

[1] Synthesis of Polymers

[Synthesis Example 1] Synthesis of Poly-1

A 3-L flask equipped with a stirrer, thermometer, nitrogen purge line and reflux condenser was charged with 172.1 g (0.40 mol) of Compound (M-1), 53.9 g (0.10 mol) of Compound (M-2) with Mw ~500 (Uniox® by NOF Corp.), and 2,000 g of toluene and heated at 70° C. Thereafter, 1.0 g of a toluene solution of chloroplatinic acid (platinum concentration 0.5 wt %) was added, and 97.0 g (0.50 mol) of Compound (M-3) was added dropwise over 1 hour. The molar ratio of the total amount of hydrosilyl groups to the total amount of alkenyl groups was 1/1. At the end of dropwise addition, the reaction solution was heated at 100° C. and aged for 6 hours. Toluene was distilled off in vacuum from the reaction solution, yielding Poly-1. Poly-1 had a Mw of 38,000 and was identified by ¹H-NMR spectroscopy (Broker Corp.) to be the desired polymer.

[Synthesis Example 2] Synthesis of Poly-2

A 3-L flask equipped with a stirrer, thermometer, nitrogen purge line and reflux condenser was charged with 217.1 g (0.40 mol) of Compound (M-4), 53.9 g (0.10 mol) of Compound (M-2) with Mw ~500 (Uniox® by NOF Corp.), and 2,000 g of toluene and heated at 70° C. Thereafter, 1.0 g of a toluene solution of chloroplatinic acid (platinum concentration 0.5 wt %) was added, and 97.0 g (0.50 mol) of Compound (M-3) was added dropwise over 1 hour. The molar ratio of the total amount of hydrosilyl groups to the total amount of alkenyl groups was 1/1. At the end of dropwise addition, the reaction solution was heated at 100° C. and aged for 6 hours. Toluene was distilled off in vacuum from the reaction solution, yielding Poly-2. Poly-2 had a Mw of 40,000 and was identified by ¹H-NMR, spectroscopy (Braker Corp.) to be the desired polymer.

[Synthesis Example 3] Synthesis of Poly-3

A 3-L flask equipped with a stirrer, thermometer, nitrogen purge line and reflux condenser was charged with 217.1 g (0.40 mol) of Compound (M-4), 70.4 g (0.10 mol) of Compound (M-5) (Blemmer® by NOF Corp.), and 2,000 g of toluene and heated at 70° C. Thereafter, 1.0 g of a toluene solution of chloroplatinic acid (platinum concentration 0.5 wt %) was added, and 97.0 g (0.50 mol) of Compound (M-3) was added dropwise over 1 hour. The molar ratio of the total amount of hydrosilyl groups to the total amount of alkenyl groups was 1/1. At the end of dropwise addition, the reaction solution was heated at 100° C. and aged for 6 hours. Toluene was distilled off in vacuum from the reaction solution, yielding Poly-3. Poly-3 had a Mw of 35,000 and was identified by ¹H-NMR spectroscopy (Bruker Corp.) to be the desired polymer.

[2] Preparation of Photosensitive Resin Composition

Examples 1-1 to 1-11 and Comparative Examples 1-1 to 1-5

Photosensitive resin compositions 1 to 16 were prepared by mixing the polymer (Poly-1 to Poly-3), photoacid generator (CPI-210S by San-Apro Ltd), epoxy compound (E-1 to E-3), benzotriazole compound (BTA-1), imidazole compound (4-MI), organic solvent (cyclopentane ne) and optional additive in accordance with the formulation shown in Table 1, and filtering the solution through a membrane filter with a pore size of 1.0 µm. All the compositions contained 0.10 part by weight of surfactant KP-341 (Shin-Etsu Chemical. Co., Ltd). Notably, E-1 to E-3, BTA-1, 4-MI, Nikalac MW-390, EP6050G, EXA-850CRP, and Tris P-PA in Table 1 are identified below.

E-1: TEP-G with epoxy equivalent 160-180 (Asahi Yukizai Corp.)

[Chem. 15]

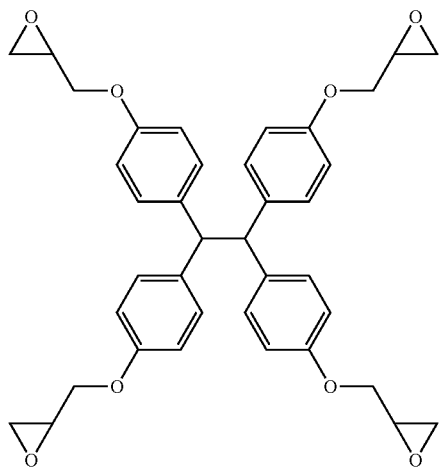

E-2: EOCN-1020 with epoxy equivalent 191-207 (Nippon Kayaku Co., Ltd.)

[Chem. 16]

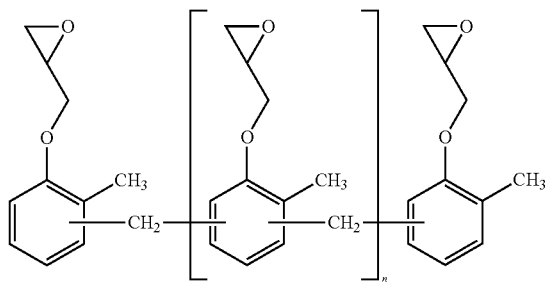

E-3: TEPIC-UC with epoxy equivalent 185-205 (Nissan Chemical Corp.)

[Chem. 17]

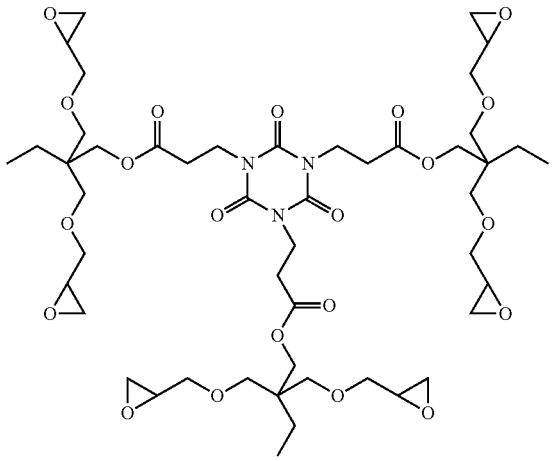

BTA-1

[Chem. 18]

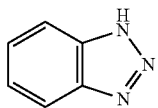

4-MI

[Chem. 19]

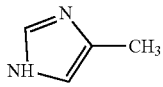

Nikalac MW-390, hexamethoxymethylmelamine (Sanwa Chemical Co., Ltd.)
EP6050G: Novolak resin with m-cresol/p-cresol=40/60, Mw=2,500-4,000, softening point 135-145° C. (Asahi Yukizai Corp.)

EXA-850CRP: bisphenol-A epoxy resin with epoxy equivalent 170-175, viscosity 3,500-5,500 mPa·s at 25° C. (DIC Corp.)
Tris P-PA: trifunctional phenol (Honshu Chemical Industry Co., Ltd.)

[Chem. 20]

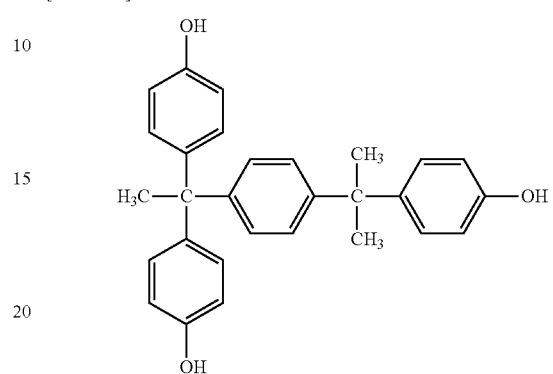

TABLE 1

| | | Photosensitive resin composition | Component (A) (pbw) | Component (B) (pbw) | Component (C) (pbw) | Component (D) (pbw) | Component (E) (pbw) | Additive (pbw) |
|---|---|---|---|---|---|---|---|---|
| Example | 1-1 | 1 | Poly-1 (100) | E-1 (10) | CPI-210S (2.0) | BTA-1 (0.05) | cyclopentanone (65) | — |
| | 1-2 | 2 | Poly-1 (100) | E-1 (60) | CPI-210S (2.0) | BTA-1 (0.05) | cyclopentanone (65) | — |
| | 1-3 | 3 | Poly-1 (100) | E-2 (20) | CPI-210S (2.0) | 4-MI (0.05) | cyclopentanone (65) | — |
| | 1-4 | 4 | Poly-1 (100) | E-3 (50) | CPI-210S (2.0) | 4-MI (0.05) | cyclopentanone (65) | — |
| | 1-5 | 5 | Poly-1 (100) | E-3 (30) | CPI-210S (2.0) | BTA-1 (0.10) | cyclopentanone (65) | — |
| | 1-6 | 6 | Poly-2 (100) | E-1 (20) | CPI-210S (2.0) | BTA-1 (0.10) | cyclopentanone (65) | — |
| | 1-7 | 7 | Poly-2 (100) | E-2 (10) | CPI-210S (2.0) | 4-MI (0.10) | cyclopentanone (65) | — |
| | 1-8 | 8 | Poly-2 (100) | E-2 (50) | CPI-210S (2.0) | 4-MI (0.10) | cyclopentanone (65) | — |
| | 1-9 | 9 | Poly-2 (100) | E-3 (10) | CPI-210S (2.0) | BTA-1 (0.03) | cyclopentanone (65) | — |
| | 1-10 | 10 | Poly-2 (100) | E-3 (80) | CPI-210S (2.0) | BTA-1 (0.03) | cyclopentanone (65) | — |
| | 1-11 | 11 | Poly-3 (100) | E-1 (40) | CPI-210S (2.0) | BTA-1 (0.05) | cyclopentanone (65) | — |
| Comparative Example | 1-1 | 12 | Poly-1 (100) | — | CPI-210S (2.0) | BTA-1 (0.05) | cyclopentanone (65) | EP6050G (10) |
| | 1-2 | 13 | Poly-1 (100) | — | CPI-210S (2.0) | 4-MI (0.05) | cyclopentanone (65) | Nikalac MW-390 (10) |
| | 1-3 | 14 | Poly-2 (100) | — | CPI-210S (2.0) | BTA-1 (0.05) | cyclopentanone (65) | EXA-850CRP (20) |
| | 1-4 | 15 | Poly-1 (100) | — | CPI-210S (2.0) | 4-MI (0.05) | cyclopentanone (65) | TrisP-PA (20) |
| | 1-5 | 16 | Poly-1 (100) | — | CPI-210S (2.0) | BTA-1 (0.05) | cyclopentanone (65) | — |

[3] Pattern Formation from Photosensitive Resin Composition and Evaluation

Examples 2-1 to 2-11 and Comparative Examples 2-1 to 2-5

Each of photosensitive resin compositions 1 to 16 was spin coated on a 8-inch silicon wafer having Cu deposited thereon by sputtering and prebaked on a hotplate at 110° C. for 5 minutes to form a photosensitive resin coating of 100 µm thick. Using an i-line stepper (NSR-2205i11D by Nikon Corp.), the photosensitive resin coating was exposed to i-line through a reticle. The resin coating was PEB at 100° C. for 2 minutes, spray developed in PGMEA for 15 minutes, and dried, forming a pattern.

Using a scanning electronmicroscope (S-4700 by Hitachi High-Technologies Corp.), the pattern was analyzed for optimum exposure dose and resolution. The optimum dose is an exposure dose at which a hole pattern with a size of 50 µm is printed to 50 µm. The resolution is the mask size through which a minimum hole pattern is resolved at the optimum dose. Also, adhesion was determined by allowing the pattern to stand in a clean room for 24 hours after development, and visually observing it to see whether or not the outer periphery of the pattern was lifted apart. Judgment assigns "good adhesion" to no lifting and "fail" to lifting.

TABLE 2

|  | Optimum dose (mJ/cm$^2$) | Resolution (µm) | Adhesion |
|---|---|---|---|
| Example 2-1 | 300 | 10 | good |
| Example 2-2 | 450 | 10 | good |
| Example 2-3 | 300 | 10 | good |
| Example 2-4 | 550 | 8 | good |
| Example 2-5 | 400 | 10 | good |
| Example 2-6 | 600 | 10 | good |
| Example 2-7 | 450 | 10 | good |
| Example 2-8 | 800 | 10 | good |
| Example 2-9 | 400 | 10 | good |
| Example 2-10 | 850 | 8 | good |
| Example 2-11 | 400 | 10 | good |
| Comparative Example 2-1 | 800 | 10 | fail |
| Comparative Example 2-2 | 1,800 | 20 | fail |
| Comparative Example 2-3 | 600 | 10 | fail |
| Comparative Example 2-4 | 900 | 20 | fail |
| Comparative Example 2-5 | 500 | 10 | fail |

[4] Preparation of Photosensitive Dry Film and Evaluation

Example 3

In a clean room at a cleanness class of 1,000, humidity 40-45%, and temperature 22-26° C., photosensitive resin composition 7 was coated onto a PET film of 38 µM thick as support film, by means of a die coater as the film coater. The coated film was passed through a hot air circulating oven (length 4 in) set at 100° C. over 5 minutes to form a photosensitive resin coating of 100 µm thick on the support film, yielding a photosensitive dry film. A PE film of 50 µm thick as the protective film was bonded to the surface of the photosensitive resin coating under a pressure of 1 MPa, yielding a protective film-bearing photosensitive dry film.

From the protective film-bearing photosensitive dry film, the protective film was stripped off. Using a vacuum laminator TEAM-100M (Takatori Corp.) with a vacuum chamber set at a vacuum of 80 Pa, the photosensitive resin coating on the support film was closely bonded to a copper substrate of 200 mm at a temperature of 60° C. After restoration of atmospheric pressure, the substrate was taken out of the laminator, and the support film was stripped off. This procedure was repeated three times to form three layers of photosensitive resin coating.

Then the photosensitive resin coating/substrate was prebaked on a hot plate at 110° C. for 5 minutes. The thickness of the photosensitive resin coating as prebaked was measured by a contact type film thickness gauge (Mitsutoyo Co., Ltd.), finding a thickness of 300 µm. Using an i-line stepper (NSR-2205i11D by Nikon Corp.), the photosensitive resin coating was exposed to i-line through a reticle. The resin coating was PEB at 100° C. for 2 minutes, puddle developed in PGMEA for 45 minutes, rinsed with deionized water, and dried, forming a pattern.

The pattern was observed under SEM (S-4700 by Hitachi High-Technologies Corp.), finding that a hole pattern of 20 µm size was resolved rectangular at an exposure dose of 1,200 mJ/cm$^2$.

The invention claimed is:

1. A photosensitive resin composition comprising
   (A) a polymer comprising repeat units having the formula (A1) and repeat units of at least one type selected from repeat units having the formula (A2) and repeat units having the formula (A3), shown below,
   (B) an epoxy compound containing on the average at least four epoxy groups per molecule,
   (C) a photoacid generator,
   (D) a benzotriazole compound and/or imidazole compound, and
   (E) an organic solvent,

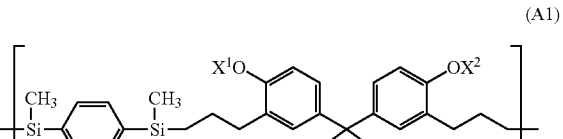

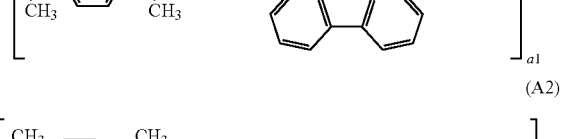

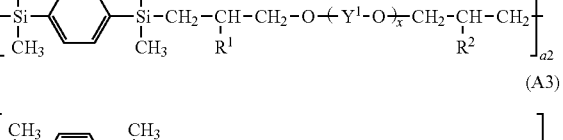

wherein $X^1$ and $X^2$ are each independently hydrogen or glycidyl group,
$Y^1$ is a $C_1$-$C_5$ alkanediyl group,
$Z^1$ is a $C_1$-$C_{10}$ straight alkanediyl group which may contain hydroxy, a $C_2$-$C_{10}$ branched alkanediyl group, or a divalent group having the formula (A4):

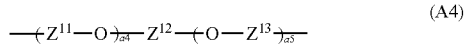

wherein $Z^{11}$ and $Z^{13}$ are each independently a $C_1$-$C_5$ alkanediyl group, $Z^{12}$ is a $C_1$-$C_{30}$ hydrocarbylene group, a4 and a5 are each independently an integer of 1 to 50, $Z^2$ and $Z^3$ are each independently a single bond or a $C_1$-$C_{10}$ alkanediyl group, $R^1$, $R^2$, $R^3$, and $R^4$ are each independently hydrogen or a $C_1$-$C_{10}$ hydrocarbyl group, a1, a2, and a3 are numbers in the range: 0<a1<1, 0≤a2<1, 0≤a3<1, and a1+a2+a3=1, x and y are each independently an integer of 1 to 50.

2. A photosensitive resin coating obtained from the photosensitive resin composition of claim 1.

3. A photosensitive dry film comprising a support film and the photosensitive resin coating of claim 2 thereon.

4. A pattern forming process comprising the steps of:
   (a) applying the photosensitive resin composition of claim 1 onto a substrate to form a photosensitive resin coating thereon,
   (b) exposing the photosensitive resin coating to radiation, and
   (c) developing the exposed resin coating in an organic solvent.

5. A pattern forming process comprising the steps of:
   (a') using the photosensitive dry film of claim 3 to form the photosensitive resin coating on a substrate,
   (b) exposing the photosensitive resin coating to radiation, and
   (c) developing the exposed resin coating in an organic solvent.

* * * * *